(12) United States Patent
Midya et al.

(10) Patent No.: US 6,240,278 B1
(45) Date of Patent: May 29, 2001

(54) SCALAR COST FUNCTION BASED PREDISTORTION LINEARIZING DEVICE, METHOD, PHONE AND BASESTATION

(75) Inventors: Pallab Midya, Schaumburg; John Grosspietsch, Libertyville, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/126,573

(22) Filed: Jul. 30, 1998

(51) Int. Cl.[7] ....................................................... H04B 1/38
(52) U.S. Cl. ........................... 455/126; 375/296; 330/149
(58) Field of Search .................................. 455/550, 575, 455/93, 114, 115, 116, 126, 127; 375/295, 296; 330/129, 149

(56) References Cited

U.S. PATENT DOCUMENTS

| | | |
|---|---|---|
| 5,023,937 | 6/1991 | Opas . |
| 5,049,832 | 9/1991 | Cavers . |
| 5,164,678 | 11/1992 | Puri et al. . |
| 5,430,416 | 7/1995 | Black et al. . |
| 5,524,285 | 6/1996 | Wray et al. . |
| 5,732,333 | 3/1998 | Cox et al. ............................. 455/126 |
| 5,867,065 | 2/1999 | Leyendecker ......................... 455/126 |

OTHER PUBLICATIONS

Cavers, James K., "Adaptation Behavior of a Feedforward Amplifier Linearizer" IEEE Transactions on Vehicular Technology, vol. 44, No. 1, Feb. 1995.

Mushtaq A. Syed and V. John Mathews, "QR—Decomposition Based Algorithms for Adaptive Volterra Filtering", IEEE Transactions on Circuits and Systems–1: Fundamental Theory and Applications, vol. 40, No. 6, Jun. 1993. pp. 372–382.

S.W. Nam, S.B. Kim, and E.J. Powers, "On the Identification of a Third–Order Volterra Nonlinear System Using a Frequency–Domain Block RLS Adaptive Algorithm", 1990 IEEE, CH2847–2/90/0000–2407. pp2407–2410.

Hyun Woo Kang, Yong Soo Cho, and Dae Hee Youn, "An Efficient Adaptive Predistorter for Nonlinear High Power Amplifier in Satellite Communication", 1997 IEEE International Symposium on Circuits and Systems, Jun. 9–12, 1997, Hong Kong. pp 2288–2291.

Murali Tummla, Michael T. Donovan, Bruce E. Watkins, and Richard North, "Volterra Series Based Modeling and Compensation of Nonlinearties in High Power Amplifiers", 1997 IEEE, 0–8186–7919–0/97. pp. 2417–2420.

Clarkson, Peter M. "Optimal and Adaptive Signal Processing" Electronic Engineering Systems Series, CRC Press pp.155–173.

Leehter Yao, William A. Sethares and Yu–Hen Hu "Identification of a Nonlinear System Modeled by a Sparse Volterra Series" 1992 IEEE, 92CH3179–9/92. pp 624–627.

*Primary Examiner*—Thanh Cong Le
(74) *Attorney, Agent, or Firm*—Douglas D. Fekete

(57) ABSTRACT

A device (400), method (1200), phone (400) and basestation (400) for providing scalar measurement-based predistortion for linearization in a radio frequency RF power amplifier, includes: a polynomial predistortion unit (406), coupled to receive an input baseband signal and polynomial coefficient weights, for predistorting the baseband signal to provide a predistorted baseband signal in accordance with the polynomial coefficient weights; an RF modulator (402), coupled to the polynomial predistortion unit (406) and to an RF generator (403), for modulating the predistorted baseband signal to provide an RF signal; an RF power amplifier (401), coupled to the RF modulator (402) and to a power supply (408), for amplifying the RF signal to provide an amplified RF signal, a scalar cost function generator (405), coupled to receive the amplified RF signal, for computing a scalar cost function; and a coefficient update unit (407), coupled to receive the scalar out-of-band-energy cost function, for tuning the polynomial coefficients in accordance with minimizing the scalar cost function to provide a linear amplified RF signal.

24 Claims, 7 Drawing Sheets

X-AXIS: INPUT SIGNAL (0.2/DIV.)
Y-AXIS: ORTHOGONAL POLYNOMIAL AMPLITUDE (0.2/DIV.)

X-AXIS: WEIGHT OF THIRD ORDER TERM ($W_3$)
Y-AXIS: WEIGHT OF FIFTH ORDER TERM ($W_5$)

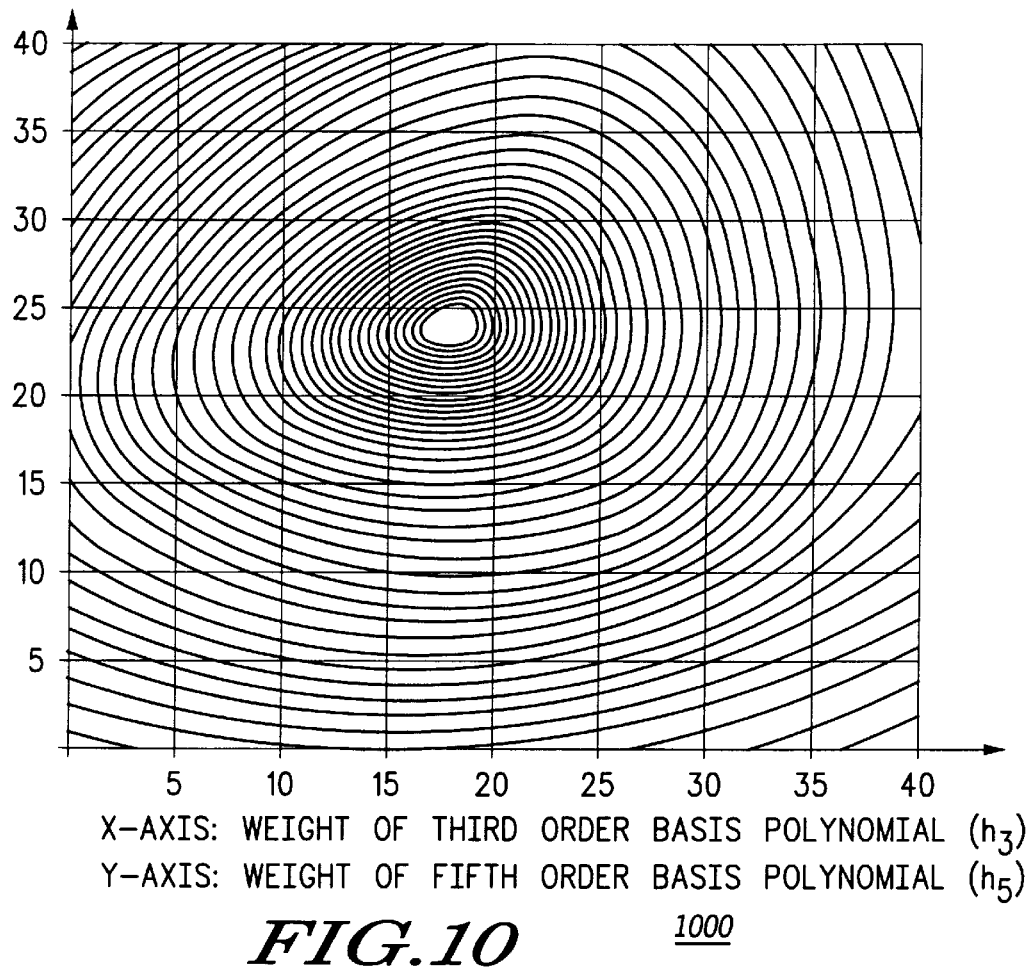
X-AXIS: WEIGHT OF THIRD ORDER BASIS POLYNOMIAL ($h_3$)
Y-AXIS: WEIGHT OF FIFTH ORDER BASIS POLYNOMIAL ($h_5$)
FIG.10   *1000*
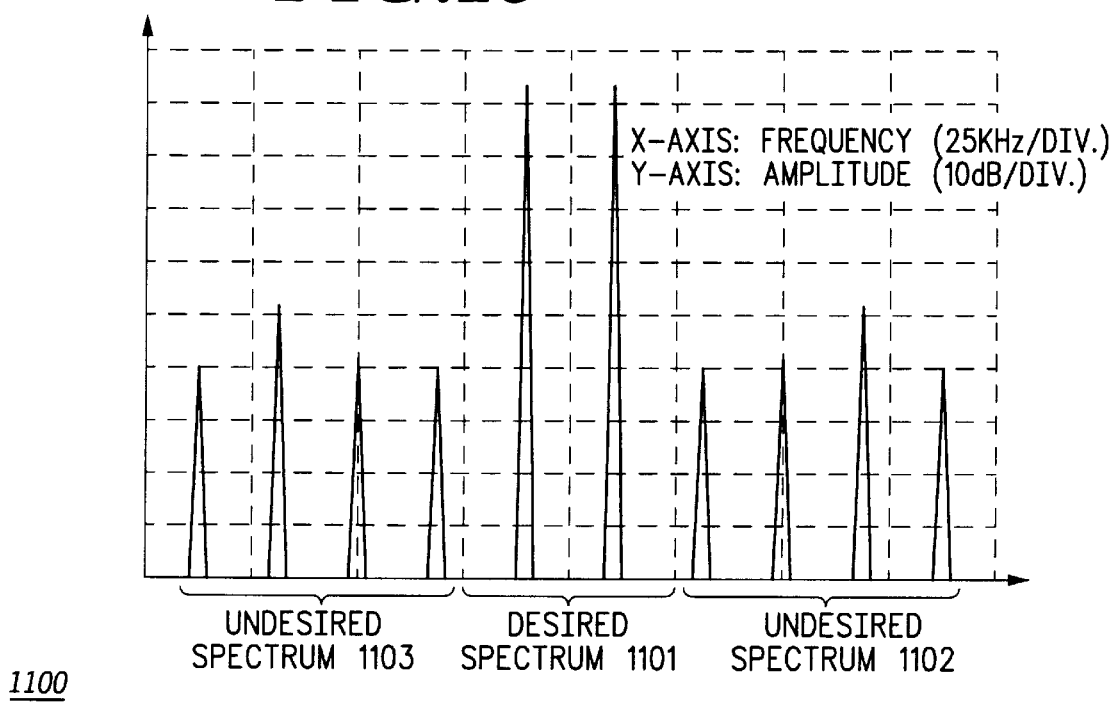
UNDESIRED SPECTRUM 1103   DESIRED SPECTRUM 1101   UNDESIRED SPECTRUM 1102
*1100*
FIG.11

US 6,240,278 B1

SCALAR COST FUNCTION BASED PREDISTORTION LINEARIZING DEVICE, METHOD, PHONE AND BASESTATION

FIELD OF THE INVENTION

The present invention relates to linearization of radio frequency (RF) power amplifiers (PAs) and more particularly to predistortion linearization of RF power amplifiers.

BACKGROUND OF THE INVENTION

Linearization of RF power amplifiers results in reduced signal distortion and reduced spectral growth of the RF output. Predistortion is a technique for distorting the input signal to the PA. This distortion is carefully chosen to be the inverse of the PA distortion such that the signal at the output of the PA is undistorted.

The distortion is a function of the devices in the PA, their nonlinear behavior, their temperature and load mismatch. In order to linearize a PA it is necessary to estimate the nonlinearity accurately. This estimation must be performed continuously or updated periodically. To linearize the PA it is necessary to use the nonlinearity estimation data in a linearization algorithm.

The linearization algorithm must have relatively low computational requirements without compromising accuracy. This invention performs linearization with medium or high accuracy depending on the application. The computational requirements are extremely low.

Linearization of PAs have been attempted in the prior art. FIG. 1, numeral 100, is a block diagram of a polar feedback scheme for linearization as is known in the art. FIG. 2, numeral 200, is a block diagram of a feedforward scheme for linearization as is known in the art.

FIG. 3, numeral 300, is a block diagram of a lookup table scheme for linearization as is known in the art. The RF signal at the output of the PA is demodulated and the in-phase and quadrature (I and Q) components of the output signal are detected. A feedback scheme or a lookup table is used to drive the error in the two signals to zero. Generation of the I and Q signals and the error cancellation constitute a complex process which is not justified in low cost systems. Other prior art includes analog feedforward correction, and use of amplitude and phase feedback loops. A popular technique for digital predistortion scheme is the predistortion lookup table approach in Cartesian coordinates. The amplifier input-output nonlinear relationship is mapped and its inverse is stored. For any given I and Q input signals the required predistortion for both signals is calculated. In the normal mode of operation the predistortion is done by using the lookup table. The table is usually constructed during a dedicated training period for the algorithm. There are related techniques where the lookup table is updated continuously.

There are numerous analog predistortion schemes where a nonlinear element like a diode is used for introducing a distortion to cancel the distortion in the amplifier. These have the benefit of high bandwidth, simplicity but are subject to significant errors due to component tolerance and/or limited cancellation. The more precise versions include a variable attenuator for providing the amplitude predistortion and a PLL for phase predistortion. These schemes operate with separate feedback loops for amplitude and phase control. While the bandwidth and stability of the loops poses a challenge for many applications, it is an appropriate method for PA linearization.

There are feedforward schemes that have been proposed where the parameters are tuned slowly and the feedforward nature allows fast response. However the correction in the schemes of prior art requires an additional class A amplifier to supplement the RF signal. This adds complexity to the RF circuitry and reduces efficiency.

Optimally, the linearization must have relatively low computational requirements without compromising accuracy. Thus, there is a need for a polynomial predistortion linearizer and method for performing power amplifier linearization with medium or high accuracy depending on the application while minimizing the computational requirements.

BRIEF DESCRIPTION OF THE DRAWINGS

FIG. 10 is a representative contour plot of the cost function as a function of the third and fifth order orthogonal polynomial predistortion terms.

FIGS. 11 and 12 are representative spectrum plots of an amplified RF signal with and without predistortion, respectively.

DETAILED DESCRIPTION OF A PREFERRED EMBODIMENT

Figure 1:
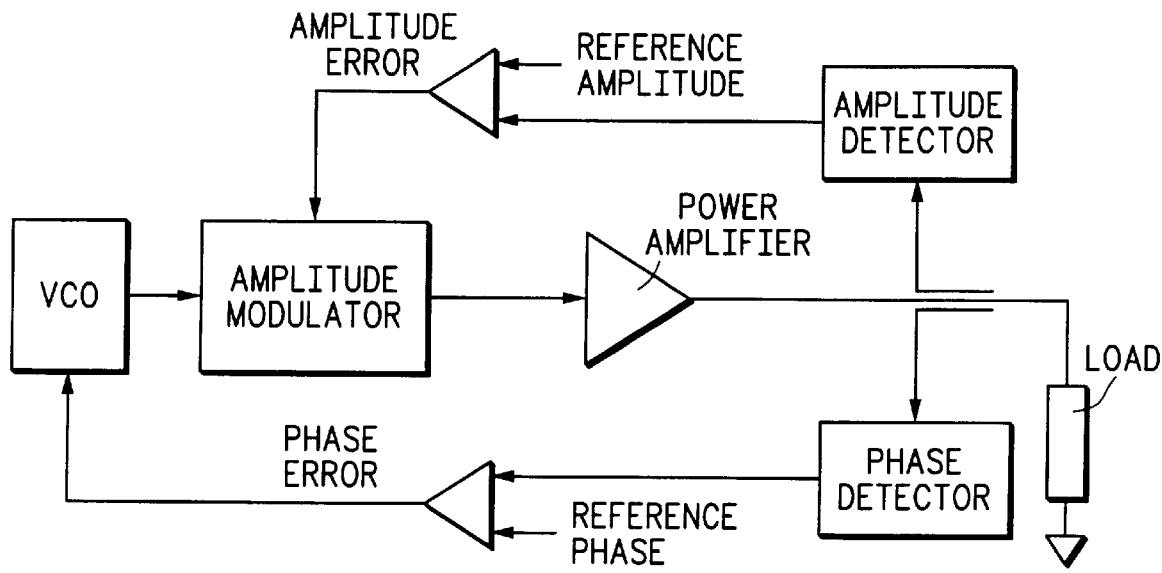
FIG. 1 is block diagram of a polar feedback scheme for linearization as is known in the art.
Figure 2:
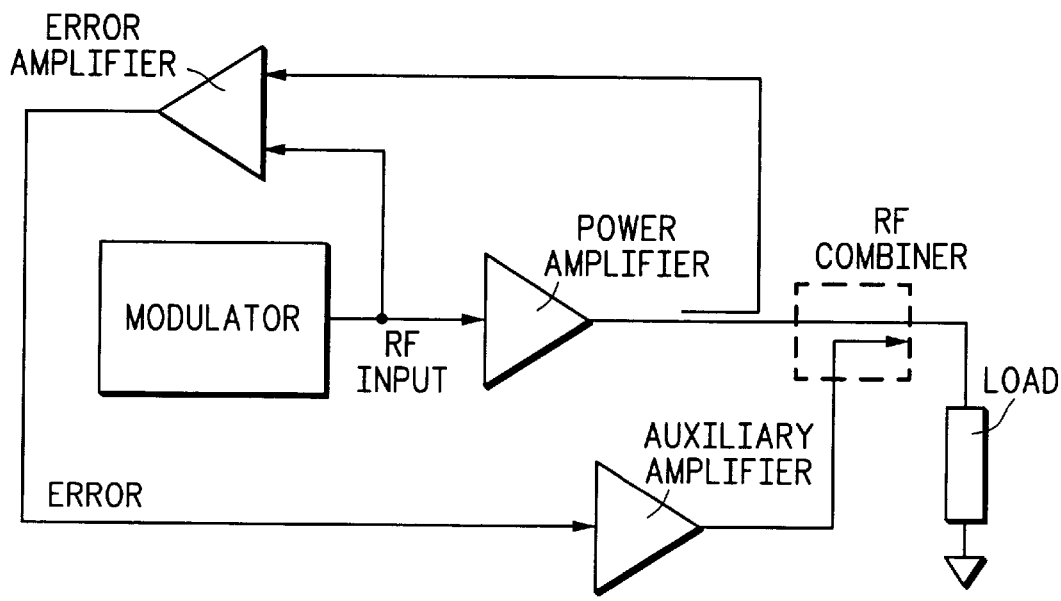
FIG. 2 is a block diagram of a feedforward scheme for linearization as is known in the art.
Figure 3:
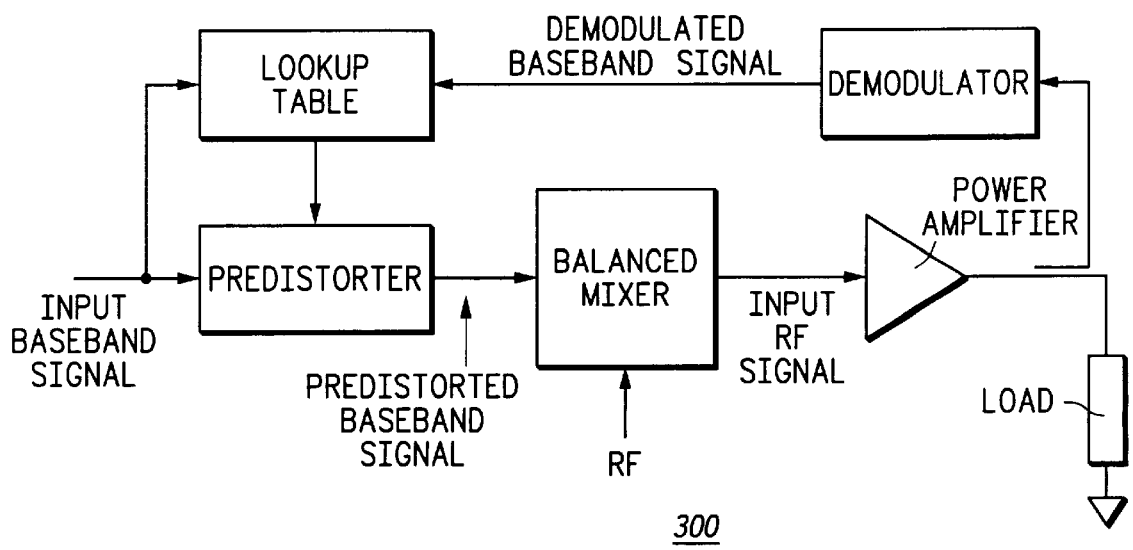
FIG. 3 is a block diagram of a lookup table scheme for linearization as is known in the art.

Predistortion is used to linearize the RF power amplifier in systems with relatively low channel bandwidth. For systems with large channel bandwidth it is a challenge to compute the optimal predistortion coefficients. The sample rate and resolution required to model the nonlinearity is very high. This results in increased hardware complexity and power consumption.

In this invention the PA nonlinearity is quantified in a novel manner. The nonlinearity results in an out of band signal. Using an appropriate filter it is relatively easy to isolate this out of band signal caused by the nonlinearity, This signal associated with the nonlinearity is a high bandwidth signal. It would require significant amount of hardware and power consumption to sample this signal in digital form.

A scalar cost function is introduced here which is the average power or energy corresponding to the nonlinearity.

In general this signal can be any convex cost function of the out of band signal caused by nonlinearity. For example this cost function can be weighted in frequency domain to emphasize certain frequencies and deemphasis other frequencies. This is particularly useful to ensure that the RF output signal meets the spectral specifications which allow variable amounts of out of band noise in different bands.

The output (y(t)) of the RF PA can be written as a sum of the linear output (l(t)) and the nonlinear output (n(t)). Note that the linear term may contain amplitude and phase variations but occur only at frequencies identical to those of the input. The nonlinear term by contrast occurs at frequencies different from those of the input as well as at the input frequencies.

$$y(t)=l(t)+n(t) \quad (1)$$

An example cost function (J) shown below is simply the integral of the power associated with the nonlinear output signal (n(t)). It is a simple quantitative scalar measure of the nonlinearity present in the power amplifier.

$$J=\int [n(t)]^2 dt \quad (2)$$

A polynomial predistortion scheme is being used here to linearize the power amplifier. The coefficients for the predistortion scheme are not known a priori. The complex baseband signal associated with an RF signal is I+jQ where j is equal to ($\sqrt{-1}$). The nonlinearity of the power amplifier is a function of the envelope of the RF signal. However, this envelope of the complex baseband signal ($\sqrt{I^2+Q^2}$) is not available directly. Also, since the signals are band limited, integral powers of the signal are band limited. However the envelope of the complex baseband signal ($\sqrt{I^2+Q^2}$) is not band limited.

For the purpose of predistortion odd terms of the power series (p3, p5, etc.) are used. These are products of the complex baseband signal and a predetermined scalar function of the power.

Subject to these constraints the polynomial predistortion terms corresponding to the third and fifth order terms of the power series are shown as follows.

$$p_3(I,Q)=(I+jQ)\{(I^2+Q^2)\} \text{ and}$$

$$p_5(I,Q)=(I+jQ)\{(I^2+Q^2)^2\} \quad (3)$$

These predetermined terms of the power series are weighted to adjust for the given power amplifier. Note that the power series coefficient weights ($w_k$) are complex. This accounts for the AM (amplitude modulation) to PM (phase modulation) nonlinearity as well as the AM to AM nonlinearity correction from the real part of the coefficients. Thus the predistortion may have the following format.

$$(I'+jQ')=(I+jQ)+w_3 p_3+w_5 p_5 \quad (4)$$

A gradient algorithm is used to compute the predistortion coefficients such that the cost function is minimized. In general, a gradient algorithm is not guaranteed to converge for an ill conditioned problem. A problem is considered to be ill conditioned if the gradient in certain directions is low and there exist local minima. A local minima may cause a false convergence to a local minimum.

Figure 9:
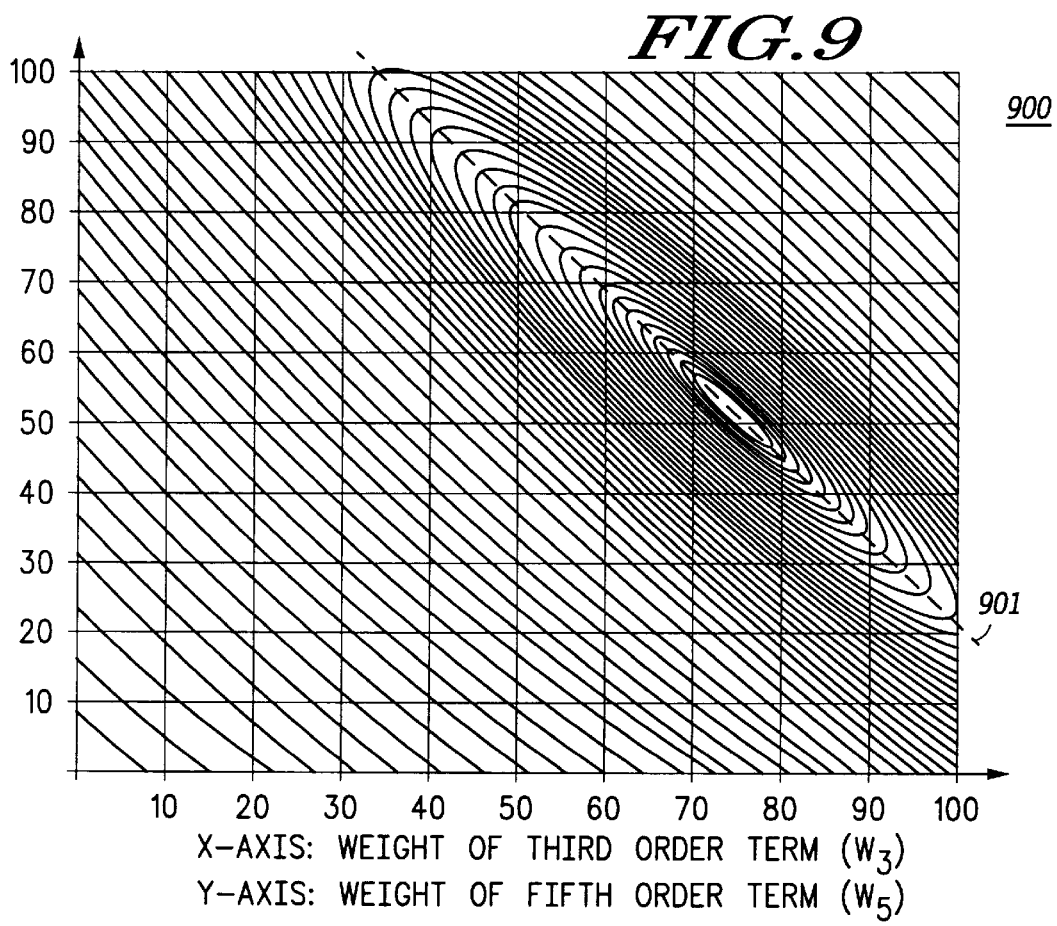
FIG. 9 is a representative contour plot of the cost function as a function of the third and fifth order predistortion terms.

The cost function corresponding to the predistortion problem is shown in FIG. 9, numeral 900. A contour plot of the cost function is plotted as a function of the weights ($w_3$ and $w_5$) corresponding to the real part of the third and fifth order power series terms. There is an axis (901) along which the gradient is very small and convergence to local minima on this axis is possible. Consequently the initial condition also affects the final converged value.

Band limited orthogonal odd order basis polynomials corresponding to the complex base band signal (I+jQ) are introduced here. The orthogonal property improves the convergence of the gradient algorithm by making the convergence of each term independent of the others. The first basis polynomial ($b_1$) is equal to the original complex baseband signal. The third and fifth order basis polynomials ($b_3$ and $b_5$) are shown below.

$$b_1(I,Q)=(I+jQ) \quad (5)$$

$$b_3(I,Q)=(I+jQ)\{(I^2+Q^2)+C_{31}\} \quad (6)$$

$$b_5(I,Q)=(I+jQ)\{(I^2+Q^2)^2+C_{53}(I^2+Q^2)+C_{51}\} \quad (7)$$

The constants $C_{31}$, $C_{53}$ and $C_{51}$ are chosen such that orthogonal property is met. In general, two functions are defined to be orthogonal if the time average of their product is zero. The orthogonal property implies that the following equation is true for a large number of data points. This property is used to calculate the value of the constants ($C_{31}$, $C_{53}$ and $C_{51}$).

$$\int b_i(t)b_j(t)dt = \sum_{t=1}^{n} b_i(t)b_j(t) = 0 \text{ for } i \neq j \quad (8)$$

Figure 8:
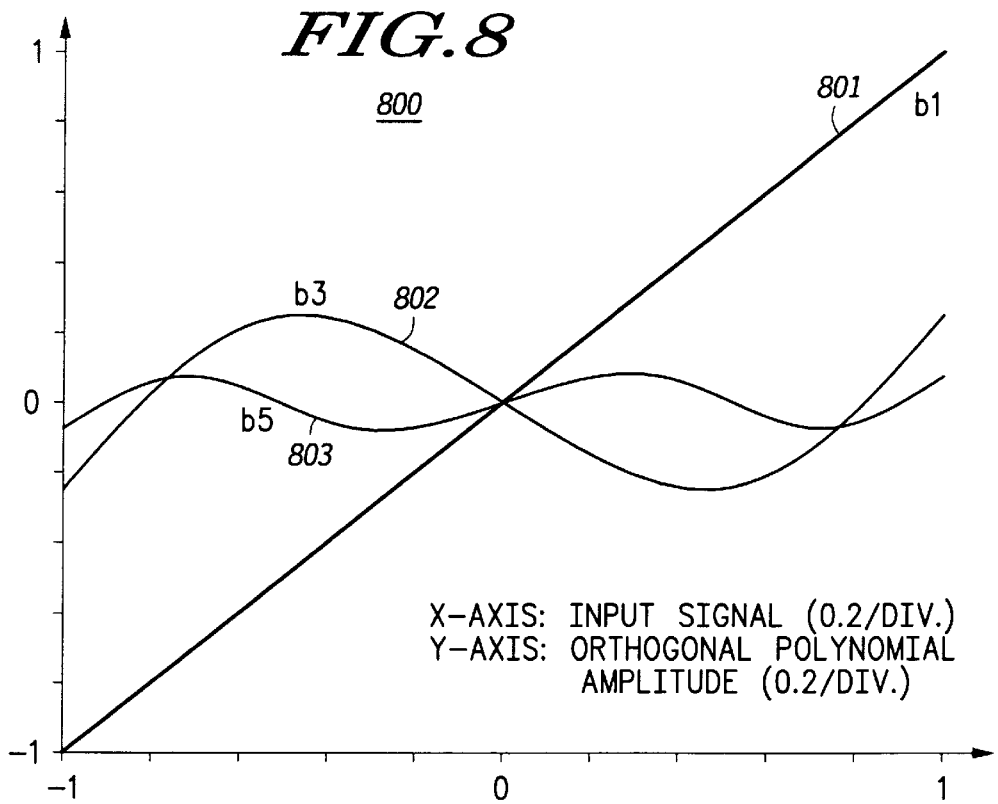
FIG. 8 is a graphical plot of one embodiment of the orthogonal polynomial basis functions.

FIG. 8, numeral 800, shows the magnitude of the first order ($b_1$, 801), third order ($b_3$, 802) and fifth order ($b_5$, 803) orthogonal basis polynomials of an input baseband signal (I+jQ) that is chosen to be a sine wave of unit amplitude. Note that the basis polynomials are dependent on the statistics of the input signal and a different input signal would have resulted in different basis functions.

The total distortion, as measured by the cost function J, can be expressed as a function of the weights ($h_3$ and $h_5$) of the third and fifth order orthogonal basis polynomials. The predistorted baseband signal (I'+jQ') associated with these basis functions are calculated below. Note that the polynomial coefficient weights for the basis functions are the only terms that change in real time.

$$(I'+jQ')=(I+jQ)[1+h_3 b_3+h_5 b_5] \quad (9)$$

$$(I'+jQ')=(I+jQ)[1+h_3\{(I^2+Q^2)+C_{31}\}+h_5\{(I^2+Q^2)^2+C_{53}(I^2+Q^2)+C_{51}\}] \quad (10)$$

FIG. 10, numeral 1000, shows a contour plot of the cost function J plotted as a function of the polynomial coefficient weights ($h_3$ and $h_5$). Note that there is a very steep gradient and it is independent of the direction. In a general case the weights are complex.

The orthogonal polynomials are also orthogonal to the desired signal ($b_1$). In the calculation of J the desired envelope is eliminated by filtering in time domain. A significant residual of the undistorted envelope is usually present even after filtering. This is allowable since the polynomials are mutually orthogonal, and the gradient algorithm converges in the presence of the undistorted envelope.

Figure 4:
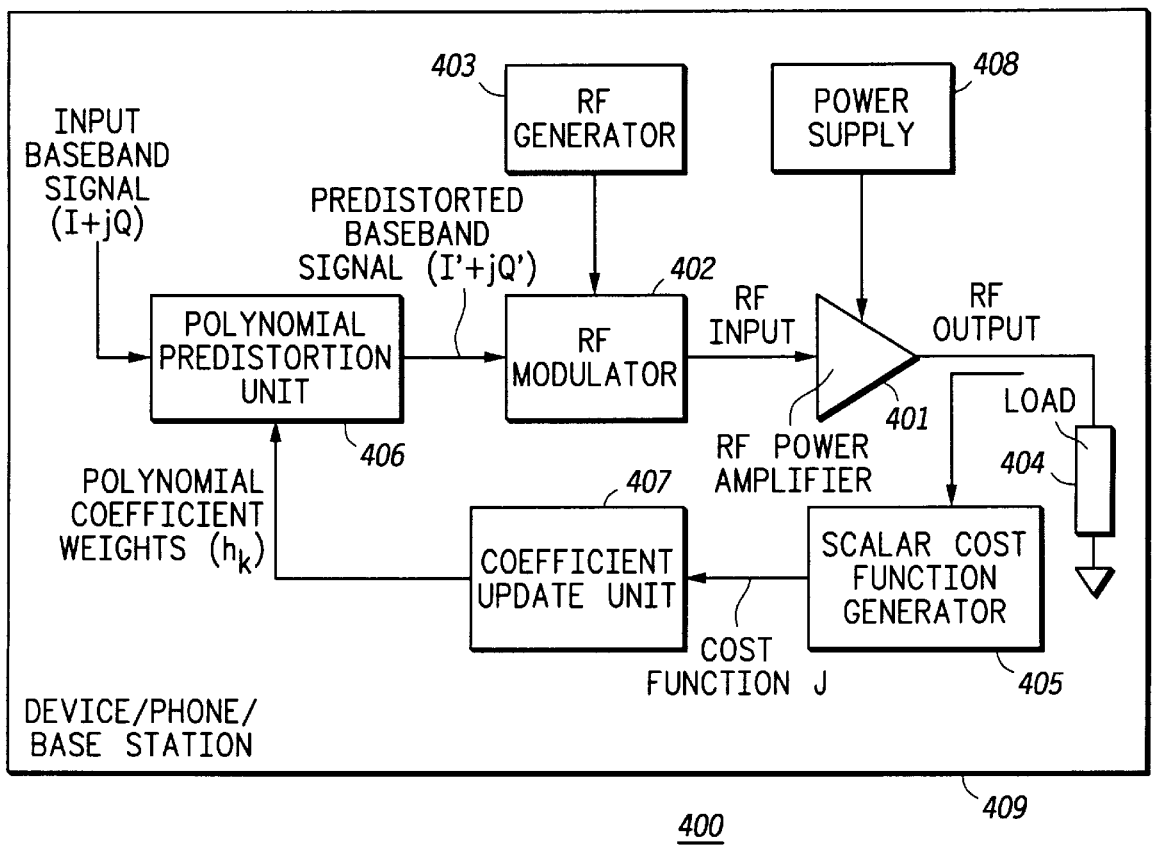
FIG. 4 is a block diagram of one embodiment of a device/phone/basestation for implementing a scalar cost function based predistortion scheme in accordance with the present invention.

FIG. 4, numeral 400, is a block diagram of one embodiment of a device/phone/basestation for providing scalar measurement-based predistortion for linearization in a radio frequency RF power amplifier in accordance with the present invention., The device/phone/basestation (409) includes: A) a polynomial predistortion unit (406), coupled to receive an input baseband signal and polynomial coefficients, for predistorting the baseband signal to provide a predistorted baseband signal in accordance with the polynomial coefficients; B) an RF modulator (402), coupled to the polynomial predistortion unit (406) and to an RF generator (403), for modulating the predistorted baseband signal to provide an RF signal; C) an RF power amplifier (401), coupled to the RF modulator (402) and to a power supply (408), for amplifying the RF signal to provide an amplified RF signal; D) a scalar cost function generator (405), coupled to receive the amplified RF signal, for computing a scalar out-of-band-energy cost function; and E) a coefficient update unit (407), coupled to receive the scalar out-of-band-energy cost function, for tuning the polynomial coefficients in accordance with minimizing the scalar out-of-band-energy cost function to provide a linear amplified RF signal.

Figure 5:
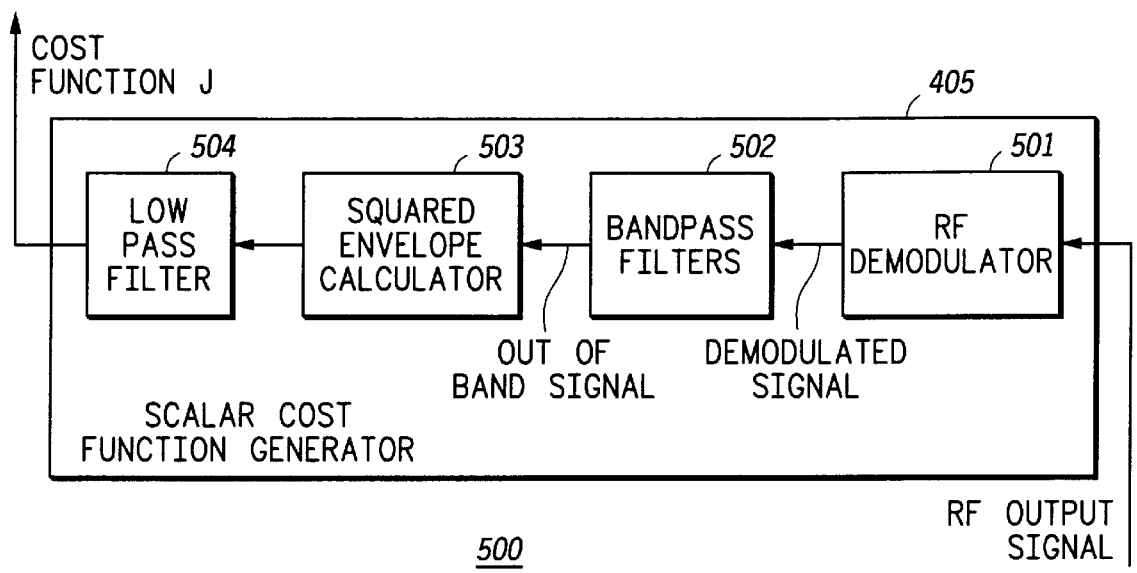
FIG. 5 is a block diagram of one embodiment of a scalar cost function generator in accordance with the present invention.

FIG. 5, numeral 500, is a block diagram of one embodiment of a scalar cost function generator (405) in accordance with the present invention. The scalar cost function generator (405) includes: A) an RF demodulator (501), coupled to receive the amplified RF signal, for demodulating the amplified RF signal to provide a demodulated signal; B) a bandpass filter (502), coupled to receive the demodulated signal, for providing an out-of-band signal; C) a squared envelope calculator (503), coupled to receive the out-of-band signal, for providing a squared envelope signal; and D) a low pass filter (504), coupled to receive the squared envelope signal, for providing the scalar cost function.

Figure 7:
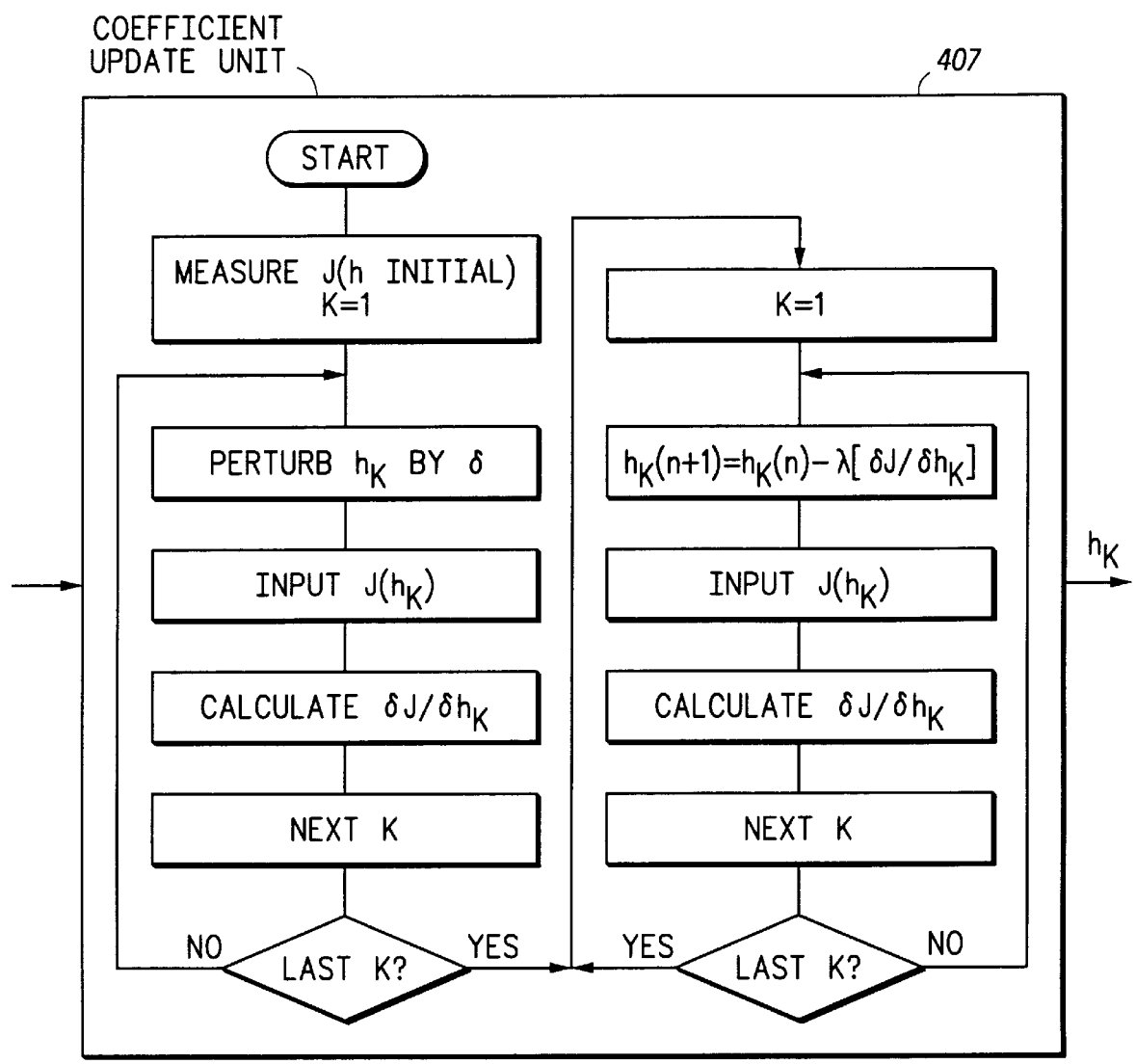
FIG. 7 is a flow chart showing one embodiment of steps implemented by the (gradient) coefficient update unit of FIG. 4.

FIG. 7, numeral 700, is a flow chart showing one embodiment of the coefficient unit wherein the coefficient update unit implements the steps in a preselected gradient algorithm. The coefficient update unit (407) typically includes a memory having stored thereon instructions and data which, when loaded into a processor cause the processor to perform the steps of a predetermined gradient algorithm that computes a set of polynomial coefficient weights that minimize the scalar cost function.

The gradient algorithm starts with an initial set of weights $(h_k)$, for example, weights corresponding to no predistortion. Each of the weights is perturbed individually and the gradient of the cost function (J) is computed with respect to that weight, After all the weights have been perturbed, the gradient corresponding to each of the weights is known.

Following this initialization the gradient algorithm is started. In the gradient algorithm each of the weights is incremented by a term proportional to the gradient of the cost function with respect to that weight. The change in the cost function due to each increment is used to update the gradient value. In this manner the cost function is minimized. In one embodiment the gradient algorithm is halted when the cost function goes below a predetermined level and restarted when it goes above another predetermined level.

Figure 6:
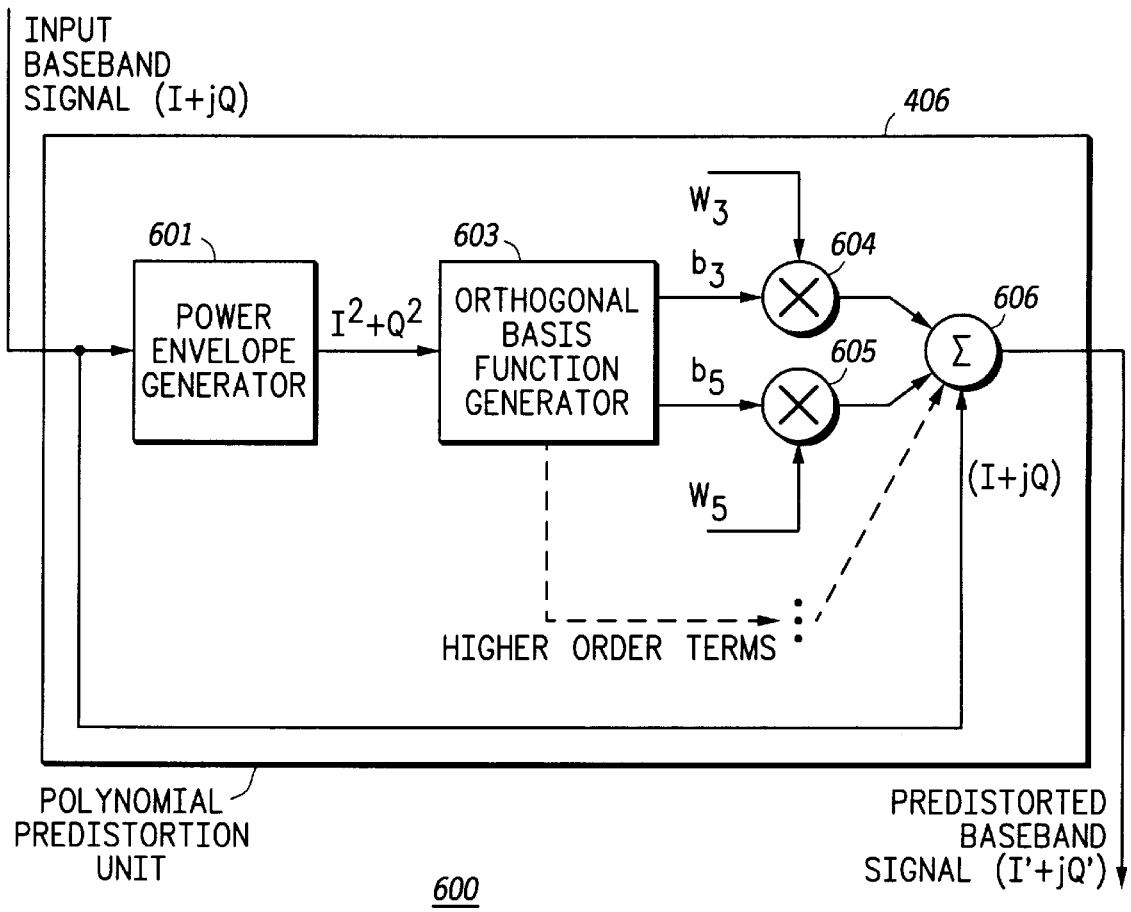
FIG. 6 is a block diagram of one embodiment of a polynomial predistortion unit of FIG. 4.

FIG. 6, numeral 600, is a block diagram of one embodiment of a polynomial predistortion unit in accordance with the present invention. The predistortion unit typically includes: A) a power envelope generator (601), coupled to receive the input baseband signal, for computing an instantaneous power envelope; B) an orthogonal basis function generator (603), coupled to the power envelope generator (601), for computing orthogonal basis functions; C) a plurality of multipliers (604, 605, . . .), each coupled to receive one of the orthogonal basis functions and one of the polynomial coefficient weights, for multiplying the orthogonal basis function with the polynomial coefficient weight; and D) a summer (606), coupled to the plurality of multipliers (604, 605, . . .) and to receive the input baseband signal, for computing the predistorted baseband signal.

The predistortion algorithm was tested with a high order polynomial nonlinearity. The signal was chosen to be a two tone signal. The predistortion was chosen to consist of two terms corresponding to the third and fifth order nonlinearities. The overall cost function was minimized and this minimum obtained was checked by exhaustive search and found to be the global minimum.

Figure 12:
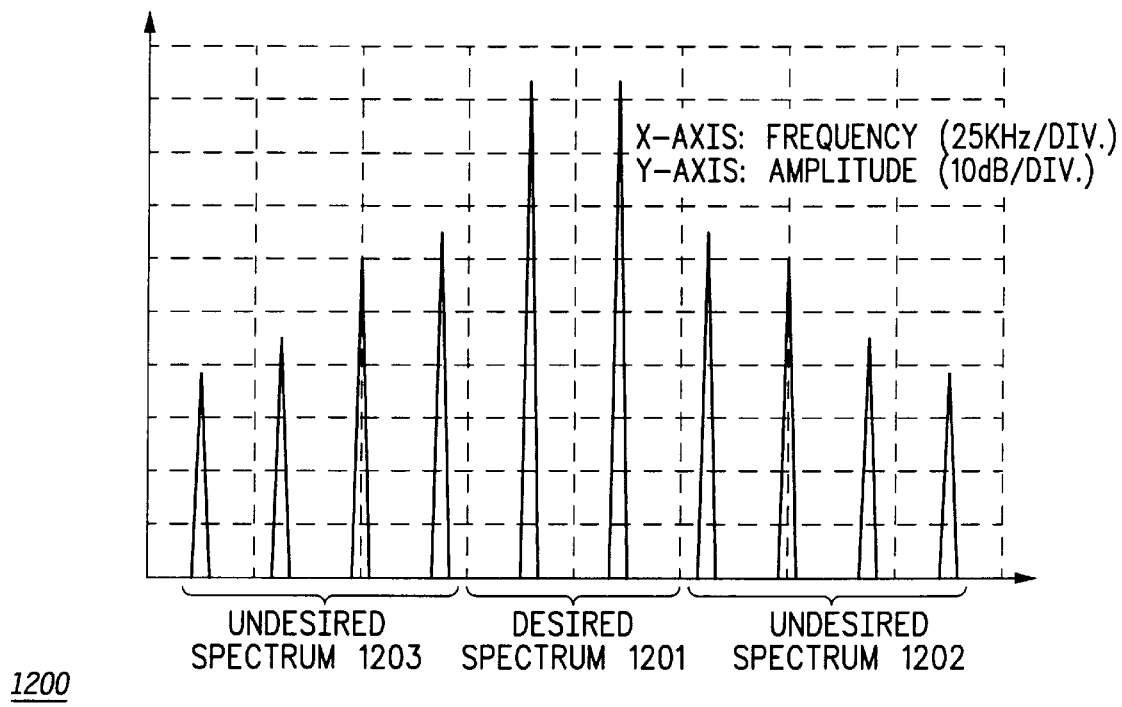

This method was tested successfully to linearize an RF power amplifier. FIG. 12 shows the spectrum at the output of the RF power amplifier without linearization. The input is a two tone signal which is a test signal of choice for RF power amplifiers. The odd intermodulation terms result in widening of the spectrum in the immediate neighborhood of the channel. This interferes with the adjacent channels and is undesirable. FIG. 11 shows the spectrum with linearization In this case the number of basis functions is chosen to be three: the fundamental and terms corresponding to the third and fifth intermodulation terms. The spectrum corresponding to these terms is reduced by about 25 dB. Both the AM to PM as well as AM to AM nonlinearity is compensated. There is no degradation in the spectrum for the uncompensated frequency band. Since the third and fifth intermodulation terms often dominate this results in a highly desirable signal. This method is general and can be used in a similar manner for any number of polynomial terms.

Figure 13:
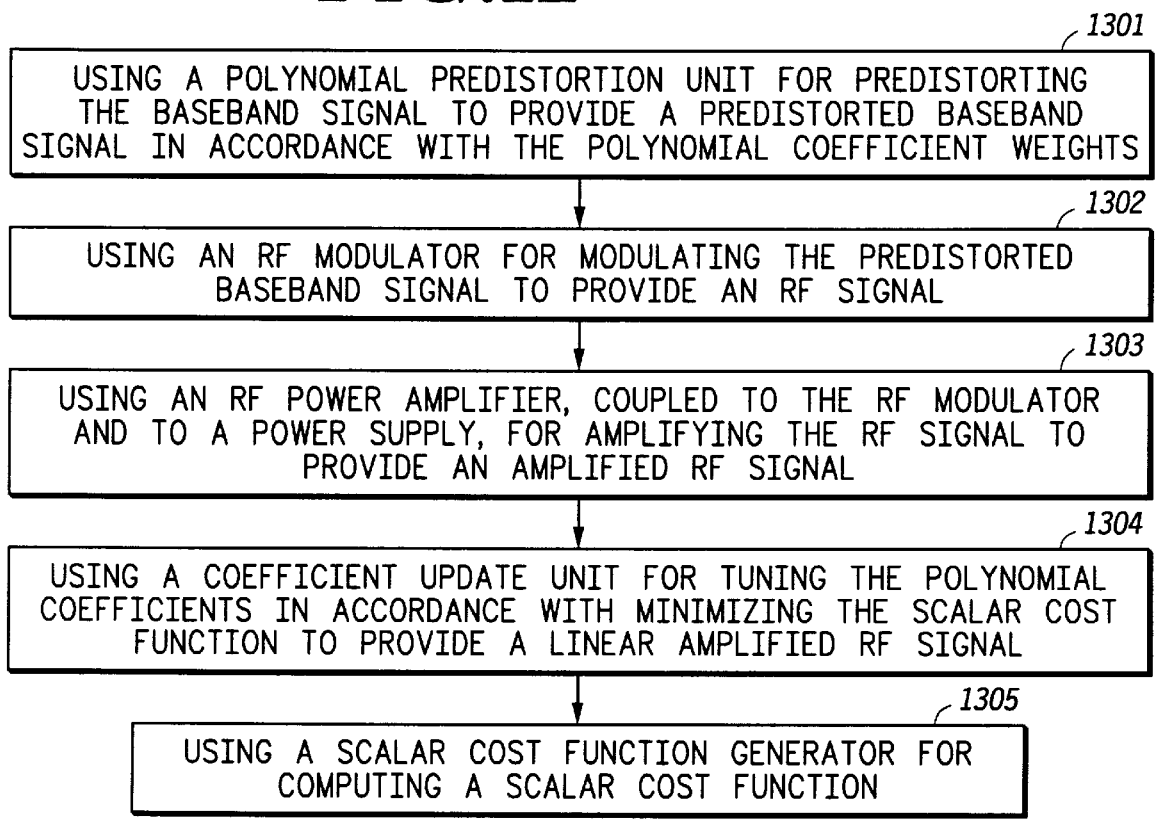
FIG. 13 is a block diagram of one embodiment of a method for implementing a scalar cost function based predistortion scheme in accordance with the present invention.

FIG. 13, numeral 1300, is a flow chart showing one embodiment of steps in accordance with the present invention. The method provides scalar measurement-based predistortion for linearization in a radio frequency RF power amplifier and includes the steps of: A) using (1031) a polynomial predistortion unit for predistorting the baseband signal to provide a predistorted baseband signal in accordance with the polynomial coefficient weights; B) using (1032) an RF modulator for modulating the predistorted baseband signal to provide an RF signal; C) using (1303) an RF power amplifier, coupled to the RF modulator and to a power supply, for amplifying the RF signal to provide an amplified RF signal; D) using (1304) a scalar cost function generator for computing a scalar cost function; and E) using (1305) a coefficient update unit for tuning the polynomial coefficients in accordance with minimizing the scalar cost function to provide a linear amplified RF signal.

Where selected, voltage of the power supply may be a function of the baseband signal. Using the coefficient update unit may include using orthogonal polynomial basis functions. In one embodiment, using the scalar cost function generator includes the steps of: A) using an RF demodulator, coupled to receive the amplified RF signal, for demodulating the amplified RF signal to provide a demodulated signal; B) using a bandpass filter, coupled to receive the demodulated signal, for providing an out-of-band signal; C) using a squared envelope calculator, coupled to receive the out-of-band signal, for providing a squared envelope signal; and D) using a low pass filter, coupled to receive the squared envelope signal, for providing the scalar cost function.

Using the coefficient update unit may include using a memory having stored thereon instructions and data which, when loaded into a processor causes the processor to perform the steps of a predetermined gradient algorithm that computes a set of polynomial coefficient weights that minimize the scalar cost function.

Using the polynomial predistortion unit may include using the input baseband signal to compute an instantaneous power envelope, using an orthogonal basis function generator to compute orthogonal basis functions, using a plurality of multipliers, each coupled to receive one of the orthogonal basis functions and one of the polynomial coefficient weights, to multiply the orthogonal basis function with the polynomial coefficient weight, and using a summer, coupled to the plurality of multipliers and to receive the input baseband signal, for computing the predistorted baseband signal.

The present invention may be embodied in other specific forms without departing from its spirit or essential characteristics, The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A device for providing scalar measurement-based predistortion for linearization in a radio frequency RF power amplifier, comprising:

A) a polynomial predistortion unit, coupled to receive an input baseband signal and polynomial coefficient weights, for predistorting the baseband signal to provide a predistorted baseband signal in accordance with the polynomial coefficient weights;

B) an RF modulator, coupled to the polynomial predistortion unit and to an RF generator, for modulating the predistorted baseband signal to provide an RF signal;

C) an RF power amplifier, coupled to the RF modulator and to a power supply, for amplifying the RF signal to provide an amplified RF signal;

D) a scalar cost function generator, coupled to receive the amplified RF signal, for computing a scalar cost function; and E) a coefficient update unit, coupled to receive the scalar out-of-band-energy cost function, for tuning the polynomial coefficients in accordance with minimizing the scalar cost function to provide a linear amplified RF signal.

2. The device of claim 1 wherein voltage of the power supply is a function of the baseband signal.

3. The device of claim 1 wherein the coefficient update unit uses orthogonal polynomial basis functions.

4. The device of claim 1 wherein the scalar cost function generator comprises:

A) an RF demodulator, coupled to receive the amplified RF signal, for demodulating the amplified RF signal to provide a demodulated signal;

B) a bandpass filter, coupled to receive the demodulated signal, for providing an out-of-band signal;

C) a squared envelope calculator, coupled to receive the out-of-band signal, for providing a squared envelope signal;

D) a low pass filter, coupled to receive the squared envelope signal, for providing the scalar cost function.

5. The device of claim 1 wherein the coefficient update unit includes a memory having stored thereon instructions and data which, when loaded into a processor causes the processor to perform the steps of a predetermined gradient algorithm that computes a set of polynomial coefficient weights that minimize the scalar cost function.

6. The device of claim 1 wherein the polynomial predistortion unit comprises:

A) a power envelope generator, coupled to receive the input baseband signal, for computing an instantaneous power envelope;

B) an orthogonal basis function generator, coupled to the power envelope generator, for computing orthogonal basis functions;

C) a plurality of multipliers, each coupled to receive one of the orthogonal basis functions and one of the polynomial coefficient weights, for multiplying the orthogonal basis function with the polynomial coefficient weight;

D) a summer, coupled to the plurality of multipliers and to receive the input baseband signal, for computing the predistorted baseband signal.

7. A method for providing scalar measurement-based predistortion for linearization in a radio frequency RF power amplifier, comprising the steps of:

A) using a polynomial predistortion unit for predistorting the baseband signal to provide a predistorted baseband signal in accordance with the polynomial coefficient weights;

B) using an RF modulator for modulating the predistorted baseband signal to provide an RF signal;

C) using an RF power amplifier, coupled to the RF modulator and to a power supply, for amplifying the RF signal to provide an amplified RF signal;

D) using a scalar cost function generator for computing a scalar cost function; and E) using a coefficient update unit for tuning the polynomial coefficients in accordance with minimizing the scalar cost function to provide a linear amplified RF signal.

8. The method of claim 7 wherein voltage of the power supply is a function of the baseband signal.

9. The method of claim 7 wherein using the coefficient update unit includes using orthogonal polynomial basis functions.

10. The method of claim 7 wherein using the scalar cost function generator includes the steps of:

A) using an RF demodulator, coupled to receive the amplified RF signal, for demodulating the amplified RF signal to provide a demodulated signal;

B) using a bandpass filter, coupled to receive the demodulated signal, for providing an out-of-band signal;

C) using a squared envelope calculator, coupled to receive the out-of-band signal, for providing a squared envelope signal; and D) using a low pass filter, coupled to receive the squared envelope signal, for providing the scalar cost function.

11. The method of claim 7 wherein using the coefficient update unit includes using a memory having stored thereon instructions and data which, when loaded into a processor causes the processor to perform the steps of a predetermined gradient algorithm that computes a set of polynomial coefficient weights that minimize the scalar cost function.

12. The method of claim 7 wherein using the polynomial predistortion unit includes using the input baseband signal to compute an instantaneous power envelope, using an orthogonal basis function generator to compute orthogonal basis functions, using a plurality of multipliers, each coupled to receive one of the orthogonal basis functions and one of the polynomial coefficient weights, to multiply the orthogonal basis function with the polynomial coefficient weight, and using a summer, coupled to the plurality of multipliers and to receive the input baseband signal, for computing the predistorted baseband signal.

13. A phone having a device for providing scalar measurement-based predistortion for linearization in a radio frequency RF power amplifier, the device comprising:

A) a polynomial predistortion unit, coupled to receive an input baseband signal and polynomial coefficient weights, for predistorting the baseband signal to provide a predistorted baseband signal in accordance with the polynomial coefficient weights;

B) an RF modulator, coupled to the polynomial predistortion unit and to an RF generator, for modulating the predistorted baseband signal to provide an RF signal;

C) an RF power amplifier, coupled to the RF modulator and to a power supply, for amplifying the RF signal to provide an amplified RF signal;

D) a scalar cost function generator, coupled to receive the amplified RF signal, for computing a scalar cost function; and E) a coefficient update unit, coupled to receive the scalar out-of-band-energy cost function, for tuning the polynomial coefficients in accordance with minimizing the scalar cost function to provide a linear amplified RF signal.

14. The phone of claim 13 wherein voltage of the power supply is a function of the baseband signal.

15. The phone of claim 13 wherein the coefficient update unit uses orthogonal polynomial basis functions.

16. The phone of claim 13 wherein the scalar cost function generator comprises:

A) an RF demodulator, coupled to receive the amplified RF signal, for demodulating the amplified RF signal to provide a demodulated signal;

B) a bandpass filter, coupled to receive the demodulated signal, for providing an out-of-band signal;

C) a squared envelope calculator, coupled to receive the out-of-band signal, for providing a squared envelope signal;

D) a low pass filter, coupled to receive the squared envelope signal, for providing the scalar cost function.

17. The phone of claim 13 wherein the coefficient update unit includes a memory having stored thereon instructions and data which, when loaded into a processor causes the processor to perform the steps of a predetermined gradient algorithm that computes a set of polynomial coefficient weights that minimize the scalar cost function.

18. The phone of claim 13 wherein the polynomial predistortion unit comprises:

A) a power envelope generator, coupled to receive the input baseband signal, for computing an instantaneous power envelope;

B) an orthogonal basis function generator, coupled to the power envelope generator, for computing orthogonal basis functions;

C) a plurality of multipliers, each coupled to receive one of the orthogonal basis functions and one of the polynomial coefficient weights, for multiplying the orthogonal basis function with the polynomial coefficient weight;

D) a summer, coupled to the plurality of multipliers and to receive the input baseband signal, for computing the predistorted baseband signal.

19. A basestation having a device for providing scalar measurement-based predistortion for linearization in a radio frequency RF power amplifier, the device comprising:

A) a polynomial predistortion unit, coupled to receive an input baseband signal and polynomial coefficient weights, for predistorting the baseband signal to provide a predistorted baseband signal in accordance with the polynomial coefficient weights;

B) an RF modulator, coupled to the polynomial predistortion unit and to an RF generator, for modulating the predistorted baseband signal to provide an RF signal;

C) an RF power amplifier, coupled to the RF modulator and to a power supply, for amplifying the RF signal to provide an amplified RF signal;

D) a scalar cost function generator, coupled to receive the amplified RF signal, for computing a scalar cost function; and E) a coefficient update unit, coupled to receive the scalar out-of-band-energy cost function, for tuning the polynomial coefficients in accordance with minimizing the scalar cost function to provide a linear amplified RF signal.

20. The basestation of claim 19 wherein voltage of the power supply is a function of the baseband signal.

21. The basestation of claim 19 wherein the coefficient update unit uses orthogonal polynomial basis functions.

22. The basestation of claim 19 wherein the scalar cost function generator comprises:

A) an RF demodulator, coupled to receive the amplified RF signal, for demodulating the amplified RF signal to provide a demodulated signal;

B) a bandpass filter, coupled to receive the demodulated signal, for providing an out-of-band signal;

C) a squared envelope calculator, coupled to receive the out-of-band signal, for providing a squared envelope signal;

D) a low pass filter, coupled to receive the squared envelope signal, for providing the scalar cost function.

23. The basestation of claim 19 wherein the coefficient update unit includes a memory having stored thereon instructions and data which, when loaded into a processor causes the processor to perform the steps of a predetermined gradient algorithm that computes a set of polynomial coefficient weights that minimize the scalar cost function.

24. The basestation of claim 19 wherein the polynomial predistortion unit comprises:

A) a power envelope generator, coupled to receive the input baseband signal, for computing an instantaneous power envelope;

B) an orthogonal basis function generator, coupled to the power envelope generator, for computing orthogonal basis functions;

C) a plurality of multipliers, each coupled to receive one of the orthogonal basis functions and one of the polynomial coefficient weights, for multiplying the orthogonal basis function with the polynomial coefficient weight;

D) a summer, coupled to the plurality of multipliers and to receive the input baseband signal, for computing the predistorted baseband signal.

* * * * *